(12) United States Patent
Constable et al.

(10) Patent No.: US 11,320,462 B2
(45) Date of Patent: May 3, 2022

(54) ELECTRICAL PROBE

(71) Applicant: Innova Electronics Corporation, Irvine, CA (US)

(72) Inventors: Douglass Constable, Lake Forest, CA (US); John Joseph Protti, Long Beach, CA (US)

(73) Assignee: Innova Electronics Corporation, Irvine, CA (US)

( * ) Notice: Subject to any disclaimer, the term of this patent is extended or adjusted under 35 U.S.C. 154(b) by 32 days.

(21) Appl. No.: 16/712,893

(22) Filed: Dec. 12, 2019

(65) Prior Publication Data
US 2021/0181239 A1    Jun. 17, 2021

(51) Int. Cl.
*G01R 15/12* (2006.01)

(52) U.S. Cl.
CPC .................. *G01R 15/125* (2013.01)

(58) Field of Classification Search
CPC ........ G01R 1/06; G01R 15/12; G01R 15/125; G01R 19/2503
See application file for complete search history.

(56) References Cited

U.S. PATENT DOCUMENTS

| 4,027,236 A | 5/1977 | Stewart |
| 4,244,403 A * | 1/1981 | Legleiter ............ B67D 7/02 141/113 |
| 4,298,837 A | 11/1981 | Koslar |
| 4,540,940 A | 9/1985 | Nolan |
| 4,599,557 A | 7/1986 | Cestaro |
| 4,949,274 A | 8/1990 | Hollander |
| 4,999,574 A | 3/1991 | Stephens |
| 5,057,770 A | 10/1991 | Kalishman |
| 5,086,277 A | 2/1992 | Hammerly |

(Continued)

FOREIGN PATENT DOCUMENTS

| DE | 4317598 | 1/1994 |
| EP | 0551199 A2 | 7/1993 |

(Continued)

OTHER PUBLICATIONS

Babcox Media, Inc., Telematics Talk WEX Awarded Homeland Security Purchase Agreement for Telematics Products and Services, Aug. 25, 2017.

(Continued)

*Primary Examiner* — Son T Le
(74) *Attorney, Agent, or Firm* — Klein, O'Neill & Singh, LLP

(57) ABSTRACT

A probe device has a main body and a probe body that can be rotatable relative to one another to change a shape of the probe device. This allows a user to use the probe device with the rotated probe body to reach behind areas that are difficult to reach into when the probe body is not rotated. The probe device could also have both a probe connector and an inductive clamp, where the probe connector could be used to measure a voltage of a conductive surface of an electronic circuit under test and the inductive clamp could be used to inductively measure a current flowing through a wire of an electronic circuit under test. The probe device is preferably configured with a grip configured to open and close the inductive clamp and a user interface positioned opposite the grip.

10 Claims, 10 Drawing Sheets

(56) References Cited

U.S. PATENT DOCUMENTS

| | | |
|---|---|---|
| 5,103,165 A | 4/1992 | Sirattz |
| 5,119,019 A | 6/1992 | George |
| D334,560 S | 4/1993 | Wilson |
| 5,250,893 A | 10/1993 | Gambill |
| 5,274,336 A | 12/1993 | Crook |
| 5,367,250 A | 11/1994 | Whisenand |
| 5,477,133 A | 12/1995 | Earle |
| 5,481,185 A | 1/1996 | Lane |
| 5,508,607 A | 4/1996 | Gibson |
| 5,572,143 A | 11/1996 | Myers |
| 5,635,843 A | 6/1997 | Borland |
| 5,672,964 A | 9/1997 | Vinci |
| 5,736,862 A | 4/1998 | Hamblin |
| 5,877,618 A | 3/1999 | Luebke |
| 5,884,202 A | 3/1999 | Arjomand |
| 6,055,468 A | 4/2000 | Kaman |
| 6,072,317 A | 6/2000 | Mackenzie |
| 6,459,968 B1 | 10/2002 | Kochie |
| 6,687,584 B2 | 2/2004 | Andreasen |
| 6,828,767 B2 | 12/2004 | Douglas |
| 6,851,612 B2 | 2/2005 | Iasso |
| 6,888,341 B2 | 5/2005 | Johnson |
| 6,941,203 B2 | 9/2005 | Chen |
| D510,287 S | 10/2005 | Chen |
| 6,975,104 B2 * | 12/2005 | Gregorec, Jr. ........... G01R 1/04 324/115 |
| 6,977,493 B2 | 12/2005 | Novak |
| 6,985,819 B2 | 1/2006 | Lipscomb |
| 7,034,517 B2 | 4/2006 | Newcombe |
| 7,085,680 B2 | 8/2006 | Huang |
| 7,184,899 B2 | 2/2007 | Cruz |
| D545,223 S | 6/2007 | Chen |
| D559,137 S | 1/2008 | Protti |
| D560,129 S | 1/2008 | Rich, II |
| D560,527 S | 1/2008 | Rich, II |
| D563,249 S | 3/2008 | Chen |
| D569,280 S | 5/2008 | Chen |
| D571,241 S | 6/2008 | Andreasen |
| 7,437,227 B2 | 10/2008 | Andreasen |
| D581,822 S | 12/2008 | Madison |
| 7,464,000 B2 | 12/2008 | Huang |
| D588,621 S | 3/2009 | Baty |
| D590,387 S | 4/2009 | Chen |
| D610,586 S | 2/2010 | Chen |
| D624,446 S | 9/2010 | Chen |
| D624,838 S | 10/2010 | Chen |
| D625,209 S | 10/2010 | Chen |
| D625,210 S | 10/2010 | Chen |
| D625,634 S | 10/2010 | Chen |
| 7,960,965 B2 | 6/2011 | Lund |
| 7,990,162 B2 * | 8/2011 | Eng, Jr. ................. G01R 27/08 324/713 |
| D646,188 S | 10/2011 | Chen |
| D646,599 S | 10/2011 | Chen |
| 8,296,481 B2 | 10/2012 | Hoshikawa |
| 8,432,154 B2 | 4/2013 | Lund |
| 8,456,152 B2 | 6/2013 | Garland |
| 8,565,959 B2 | 10/2013 | Brown, Jr. |
| 8,600,610 B2 | 12/2013 | Bertosa |
| 8,811,008 B2 | 8/2014 | Selkirk |
| 8,892,271 B2 | 11/2014 | Breed |
| 9,063,191 B2 | 6/2015 | Whisenand |
| 9,183,681 B2 | 11/2015 | Fish |
| D745,029 S | 12/2015 | Gray |
| D746,316 S | 12/2015 | Gray |
| D746,323 S | 12/2015 | Gray |
| 9,213,332 B2 | 12/2015 | Fish |
| D747,734 S | 1/2016 | Gray |
| D749,623 S | 2/2016 | Gray |
| 9,262,254 B2 | 2/2016 | Bertosa |
| 9,292,977 B2 | 3/2016 | Bertosa |
| D757,059 S | 5/2016 | Gray |
| 9,329,633 B2 | 5/2016 | Selkirk |
| D770,462 S | 11/2016 | Gray |
| 9,513,320 B2 | 12/2016 | Whisenand |
| 9,858,731 B2 | 1/2018 | Fish |
| 9,904,634 B2 | 2/2018 | Case, Jr. |
| 10,295,333 B2 | 5/2019 | Fish |
| 10,467,906 B2 | 11/2019 | Fish |
| 10,837,994 B2 | 11/2020 | Whisenand |
| 2005/0182535 A1 | 8/2005 | Huang |
| 2005/0273218 A1 | 12/2005 | Breed |
| 2006/0097741 A1 | 5/2006 | Payman |
| 2007/0038338 A1 | 2/2007 | Larschan |
| 2007/0290673 A1 | 12/2007 | Kim |
| 2009/0248222 A1 | 10/2009 | McGarry |
| 2011/0098663 A1 * | 4/2011 | Zinn ................. A61M 39/12 604/288.01 |
| 2012/0212499 A1 | 8/2012 | Haddick |
| 2013/0127980 A1 | 5/2013 | Haddick |
| 2013/0201316 A1 | 8/2013 | Binder |
| 2014/0032014 A1 | 1/2014 | Debiasio |
| 2014/0046508 A1 | 2/2014 | Himmelstein |
| 2015/0045993 A1 | 2/2015 | Cooper |
| 2015/0206357 A1 | 7/2015 | Chen |
| 2015/0346718 A1 | 12/2015 | Stenneth |
| 2016/0046373 A1 | 2/2016 | Kugelmass |
| 2016/0114745 A1 | 4/2016 | Ricci |
| 2016/0147223 A1 | 5/2016 | Edwards |
| 2016/0161560 A1 * | 6/2016 | Barden ................ G01R 15/125 324/418 |
| 2016/0194014 A1 | 7/2016 | Rajendran |
| 2016/0274168 A1 * | 9/2016 | Cabot .................... G01R 31/50 |
| 2017/0045565 A1 | 2/2017 | Whisenand |
| 2017/0186054 A1 | 6/2017 | Fish |
| 2017/0267192 A1 | 9/2017 | Chen |
| 2018/0101775 A1 | 4/2018 | Fish |
| 2018/0137693 A1 | 5/2018 | Raman |

FOREIGN PATENT DOCUMENTS

| | | |
|---|---|---|
| KR | 200306499 Y1 | 3/2003 |
| KR | 20040052093 | 6/2004 |
| WO | 1990012326 A1 | 10/1990 |
| WO | 2004104606 A1 | 12/2004 |

OTHER PUBLICATIONS

SAE International, SAE Vehicle Interface Methodology Standard Proposal—Status Report Dec. 2015 SC31 Meeting in Auburn Hills, MI, Sep. 22, 2016, 11 pages, www.sae.org.

SAE International, Surface Vehicle Standard J2735, Dedicated Short Range Communications (DSRC) Message Set Dictionary, Mar. 2016, 267 pages, www.sae.org.

SAE International, Surface Vehicle Standard J2945/1, On-Board System Requirements for V2V Safety Communications, Mar. 2016, 127 pages, www.sae.org.

U.S. Department of Transportation—National Highway Traffic Safety Administration (Daniel C. Smith) Federal Motor Vehicle Safety Standards: Vehicle-to-Vehicle (V2V) Communications, Aug. 20, 2014, 9 pages, Federal Register vol. 79, No. 161, Washington, D.C.

U.S. Department of Transportation—National Highway Traffic Safety Administration, NHTSA Issues Notice of Proposed Rulemaking and Research Report on Vehicle-to-Vehicle Communications, Vehicle-to-Vehicle Communication Technology, Dec. 13, 2016, 4 pages, vol. 1, https://icsw.nhtsa.gov/safercar/v2v/pdf/V2V_NPRM_Fact_Sheet_121316_v1.pdf.

"Probe Manual", INNOVA 001221, publication date is at least as early as Dec. 11, 2019, 7 pages.

Power Probe, "The Ultimate Circuit Tester", Webpage http://www.powerprobe.com/, Jan. 3, 2004, 2 pages.

Power Probe, "ECT 2000 Manual", publication date is at least as early as Dec. 11, 2019, 27 pages.

Power Probe, "Power Probe and ECT 2000 Kit", http://www.powerprobe.com/, Jan. 3, 2004, 2 pages.

"Power Probe Instructions for ECT and Power Probe", publication date is at least as early as Dec. 11, 2019, 24 pages.

"LM3914 Datasheet, National semiconductor", Jan. 2000, 20 pages.

Exhibit 15, "Nuvoton 1T 8051-based Microcontroller, N76E003 Datasheet", Rev. 1.09, Aug. 3, 2020, 103 pages.

(56) References Cited

OTHER PUBLICATIONS

ACE Technology Co., Ltd, "ACE735E, 36V Input Standoff Voltage, 1.5A Step-Down Converter", version 1.1, http://www.ace-ele.com/, retrieved in 2021, 10 pages.
ON Semiconductor, "N-Channel Enhancement Mode Field Effect Transistor", NDS7002A-D, www.onsemi.com, Rev. 4, Jun. 2021, 11 pages.
Power Probe, "Instruction manual for Power Probe III", publication date is at least as early as Dec. 11, 2019, 16 pages.
"Sun Probe Instruction Manual" http://car0909.com/kwa-references_board_v-388, printed from web on Jun. 15, 2021, 6 pages.
Unisonic Technologies Co., Ltd, "UTT50P06, power MOSFET", www.uniconic.com.tw, 2011, 3 pages.
Power Probe Tek, "Pro Series The Maestro", www.powerprobetek.com, publication date is at least as early as Dec. 11, 2019, 31 pages.
Power Probe Tek, "Power Probe 3EZ manual", www.powerprobetek.com, publication date is at least as early as Dec. 11, 2019, 56 pages.
Power Probe Tek, "Power Probe 3S manual", www.prowerprobetek.com, publication date is at least as early as Dec. 11, 2019, 16 pages.
Power Probe, "Power Probe 4 manual", www.powerprobe.com, publication date is at least as early as Dec. 11, 2019, 28 pages.
Power Probe, "The Hook Instruction Manual", www.powerprobe.com, publication date is at least as early as Dec. 11, 2019, 20 pages.
Power Probe, "Instruction Manual for the Power Probe I and II", www.powerprobe.com, publication date is at least as early as Dec. 11, 2019, 14 pages.
Power Probe, "Tools for the Automotive Technician", www.powerprobe.com, 2009, 10 pages.
Power Probe, "Product Catalogue 2020", powerprobe-emer.com, 24 pages.
MFS, "Sub-miniature Switches", retrieved in 2021, 10 pages.

* cited by examiner

ELECTRICAL PROBE

CROSS-REFERENCE TO RELATED APPLICATIONS

Not Applicable

STATEMENT RE: FEDERALLY SPONSORED RESEARCH/DEVELOPMENT

Not Applicable

TECHNICAL FIELD

This application relates to electronic multimeter systems and methods.

BACKGROUND

Traditional multimeters have a housing comprising measurement circuitry and pen-like terminals (i.e. connectors). These pen-like terminals can be applied to conductive surfaces of an electronic device to measure voltage between two conductive surfaces of the electronic device. A user could turn a dial on the housing of a traditional multimeter to switch the multimeter from one mode to another. Once the traditional multimeter is set to the correct mode, the user could apply the terminals to the electronic device.

Such multimeters, however, can be rather clumsy to use, as the user needs to first find a suitable location to place the multimeter housing, place the housing down on the suitable location, turn the dial, and then use both hands to apply the multimeter terminals to the electronic device while preventing wires connecting the terminal to the housing from pulling the housing away from its location. Other types of terminals with longer wires could be attached to the multimeter, but storing and organizing the different types of terminals within reach of a user can be troublesome, resulting in misplaced terminals. Moreover, the long, pen-like terminals are not easily maneuverable in tight spaces. For example, a test location may be located behind obstructions which block a traditional pen-like terminal from easily reaching the test location.

U.S. Pat. No. 7,848,899 to Cruz teaches an electrical test device having alligator clips disposed at the end of cables. This allows the cables to maneuver around obstructions while a user applies the alligator clips to a test location. Applying alligator clips while reaching around an obstruction, however, is quite difficult without a clear line of sight, and the ability of alligator clips to navigate such areas are limited by the size and configuration of the alligator clips themselves. Cruz' device is also rather clumsy to use, as the user, again, needs to first find a suitable location to place the housing of the electrical test device, place the electrical test device down on the suitable location, apply the alligator clips to a test location, then activate Cruz' keypad to simultaneously apply power and measure parameters, such as voltage, to the device under test.

Moreover, Cruz' device is configured to provide current sourcing to an electrical system while simultaneously providing multi-meter functionality for selective measurement of a plurality of parameters. Such a device can be dangerous to use, as a user may forget to turn off Cruz's power sourcing functionality before removing the alligator clips. This is particularly problematic if Cruz' alligator clips are applied to a test location behind an obstruction, as a user reaching around an obstruction may accidentally touch a conductive area of the alligator clip if the user cannot see behind the obstruction.

Thus, there is a need for improved multimeter systems and methods for testing electronic devices.

BRIEF SUMMARY

A probe device is disclosed for applying power to, or alternatively for measuring attributes (e.g. voltage, current) of, an electronic circuit under test. The probe device typically has a user interface opposite a finger-gripping surface of a grip. The user interface allows a user to switch the probe device between discrete modes, such as a mode that measures attributes of the electronic circuit under test and a mode that applies power to the electronic circuit under test. The user interface preferably defaults to be in a mode that does not apply power to the electronic circuit under test when a user is not actively applying pressure to the user interface. This maximizes safety during use, so that a forgetful user does not accidentally apply power to themselves. Since the user interface is located opposite the finger-gripping surface of the grip, the probe device has the ability to allow a user to easily and conveniently measure attributes (e.g. voltage, current) of an electronic circuit under test, apply power to an electronic circuit under test, apply ground to an electronic circuit under test, and control operation of the probe device—all with only one hand.

The probe device generally also has a power supply terminal, a ground connector, and a probe connector. The power supply terminal electronically couples to a power source, the grounding terminal electronically couples to a ground source, and the probe connector has a conductive tip that can be applied to a conductive terminal of an electronic circuit under test. A user could couple the power supply terminal to a power source (e.g. by inserting a male plug into a female power supply terminal), couple the ground connector to a ground source (e.g. by clipping an alligator clip to an exposed ground source) and could then maneuver the grip of the probe device to apply the conductive tip of the probe connector to various exposed or obstructed conductive surfaces of the electronic circuit under test. Positioning the probe connector on the end of a handle having a grip and a user interface that controls the probe device improves the ability of a user to control the probe device with only one hand.

The probe device can have a rotatable probe body relative to its main body that allows a user to reach behind areas that are difficult to reach with a straight probe device with only a single straight physical configuration. With such a probe device, when the user needs to apply a conductive probe tip to a conductive surface of the electronic circuit under test, and the conductive surface is blocked by an obstruction, the user can rotate the probe body to change its physical configuration. The altered probe device could then be maneuvered so that the conductive probe tip can reach behind the obstruction to contact the previously inaccessible conductive surface of the electronic circuit under test.

The probe device could also comprise a mechanism, such as an inductive clamp, useful to measure current through a wire. Preferably the probe is configured so that the user of the probe device could simply depress a lever to open the clamp and place the clamp over a wire of the electronic circuit under test and release the lever to close the clamp around the wire. Current running through the wire could then be easily and conveniently measured. Preferably both the probe connector and the inductive clamp are mounted to an end of the probe device opposite a handle that the user holds, to allow for easy operation of both the probe connector and the inductive clamp by a user holding the probe device by its handle.

In one embodiment, the probe device has a probe body and a main body that are pivotally coupled to one another to change the shape and configuration of the probe device, allowing the probe connector to reach obstructed or otherwise hard-to-access conductive areas of the electronic device. In one configuration, the probe body and the main body could be aligned together, such that a probe axis of the probe connector along the probe connector length and a main axis of the main body along the main body length are substantially co-axial or parallel to one another. In another configuration, a user could move the probe body about a joint between the probe body and the main body to pivot or rotate the probe connector between at least two angled positions relative to the main axis of the main body. In this manner, portions of the probe device could be tilted and/or rotated such that the probe axis and the main axis are oriented at different angles relative to one another. This allows the probe connector to reach hard-to-access areas of the electronic device that would be otherwise unreachable if the probe body were unable to pivot or rotate relative to the main body.

A main switch on the grip of the probe device can be manipulated by a user to switch a mode of the probe device. The main switch could switch the probe device between different modes, for example a measuring mode that instructs the probe device to measure an attribute (e.g. voltage, current) of a circuit via the probe connector, a power mode that instructs the probe device to apply power from the power supply terminal to the probe connector, and a ground mode that instructs the probe device to apply ground from the ground connector to the probe connector. The main switch could have more or less modes in other embodiments, and/or additional switches could be used to allow or activate additional features of the probe device, such as a voltage switch that alters how much voltage to send from the power supply terminal to the probe connector when the probe device is in power mode, or a current switch that instructs the probe device to measure current instead of voltage and/or shifts the probe device between or among one or more other current measurement modes.

In some embodiments, the probe body could have an inductive clamp that allows the probe device to measure current via induction. This allows the probe device to measure voltage using the probe connector and allows the probe device to measure current via the inductive clamp. The inductive clamp could have a lever coupled to the grip that allows a user to pull the lever to open the clamp and release the lever to close the clamp over a wire under test, or vice-versa. The inductive clamp could be positioned on a side of the probe connector, allowing a user to use the inductive clamp or any probe connector simply by manipulating the grip of the probe device and controlling the probe device with a thumb—all without the user ever needing to remove his/her hand from the probe device. Another switch of the probe device could be used to switch the inductive clamp on and off, and/or could be configured to adjust a mode of the inductive clamp between a plurality of modes (e.g. a 1 mV/A mode and a 10 mV/A mode) Preferably, one or more switches is positioned on a user interface opposite a clamp lever, allowing a user to operate the user interface (e.g. measure/apply voltage, adjust settings) with a thumb while simultaneously operating the clamp lever with a finger, such as an index finger.

In another embodiment, a probe device may comprise a ground connector, a hand-held main body and a probe body. The ground connector may be electronically coupled to a ground source. The hand-held main body may be grippable by a person during measurement of a voltage of an external electrical circuit. The hand-held main body may define a main body axis extending along a length of the main body. The probe body may define a probe body axis extending along the length of the probe body. The probe body may define a conductive tip disposed at a distal end of the probe body, along the probe body axis. The conductive tip may be adapted for abutting electrical contact with the external electrical circuit.

The main body and the probe body may define adjacent mating surfaces extending non-normal to the main body axis.

The probe body may be rotatably coupled to the main body via a joint that allows rotation of the probe body between a first position and at least one second position. In the first position, the probe body axis may be disposed coaxial with the main body axis. In the at least one second position, the probe body axis may extend at an angle displaced from the main body axis. The rotation of the probe body may be operative to progressively increase a displacement angle defined by the probe body axis and the main body axis to facilitate contact of the conductive tip of the probe body to the external electrical circuit disposable at a location offset from the main body axis.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
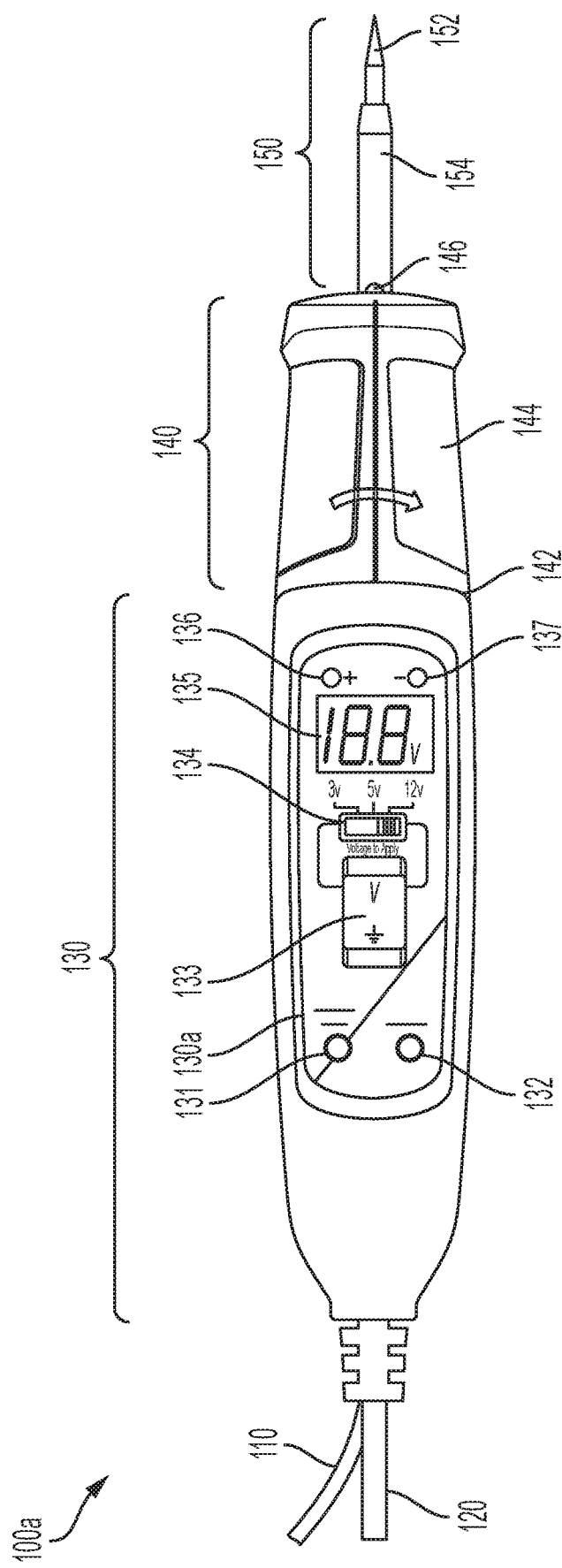
FIG. 1 is a top view of an exemplary probe device having a probe body and a main body coupled by a joint 142.

Referring now to the drawings, various embodiments of a probe device are shown for measuring attributes and/or applying power to an electronic circuit under test.

Figure 2:
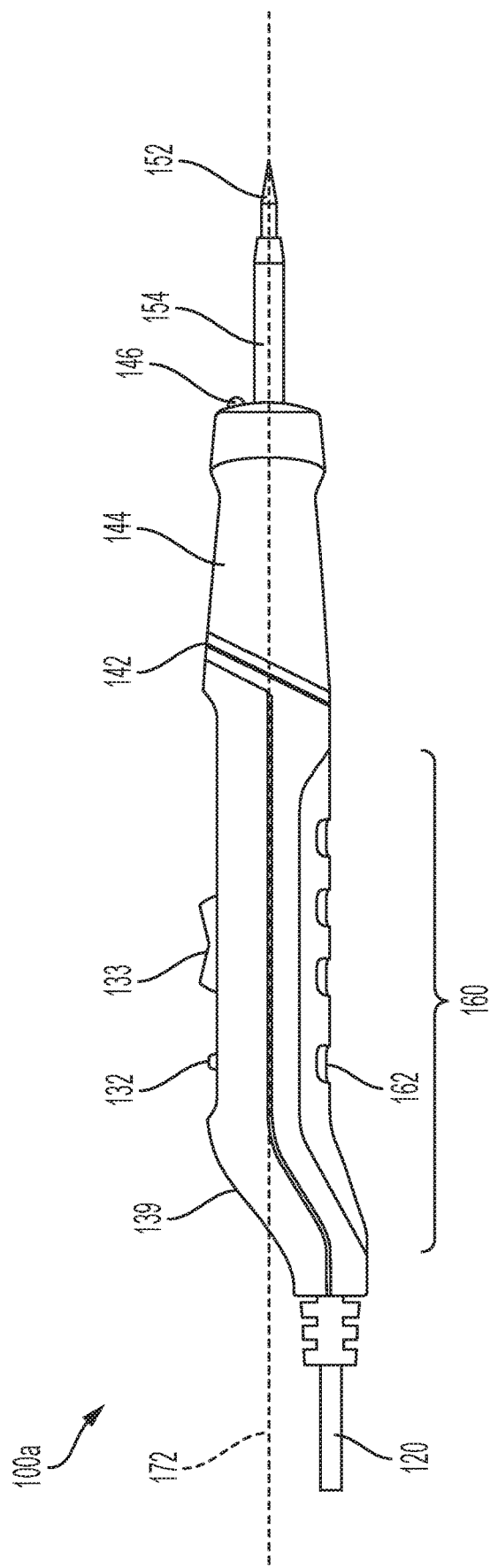
FIG. 2 is a side view of the probe device of FIG. 1.
Figure 3A:
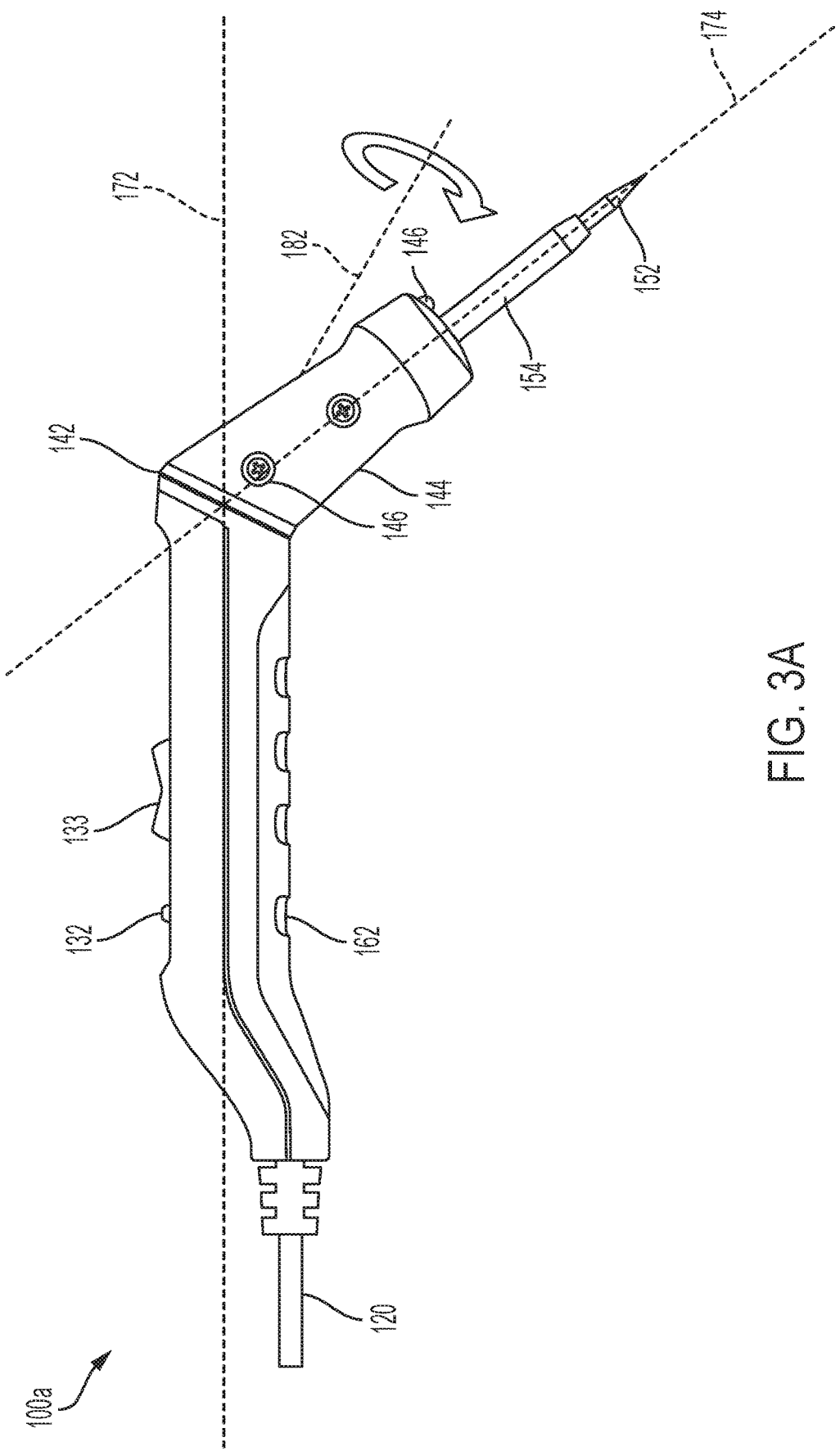
FIG. 3A is a side view of the probe device of FIG. 2, having the probe body and the main body rotated about the joint 142.

Probe device 100a, shown in FIGS. 1-3A, can have rotatable probe body 140 that allows a user to extend the conductive tip 152 of probe connector 150 into areas which are difficult to reach into with a straight probe body. A user may apply the conductive probe tip 152 to a conductive surface of an electronic circuit under test where the conductive surface is blocked by an obstruction that cannot accommodate the straight probe device 100*a* shown in FIG. 2 from reaching. The user may then rotate probe body 140 relative to main body 130 as shown in FIG. 3A to change the orientation of the probe connector 150 relative to the orientation of the main axis of the probe body and/or handle so that the conductive probe tip 152 can reach behind the obstruction to contact the conductive surface of the electronic circuit under test.

Figure 6A:
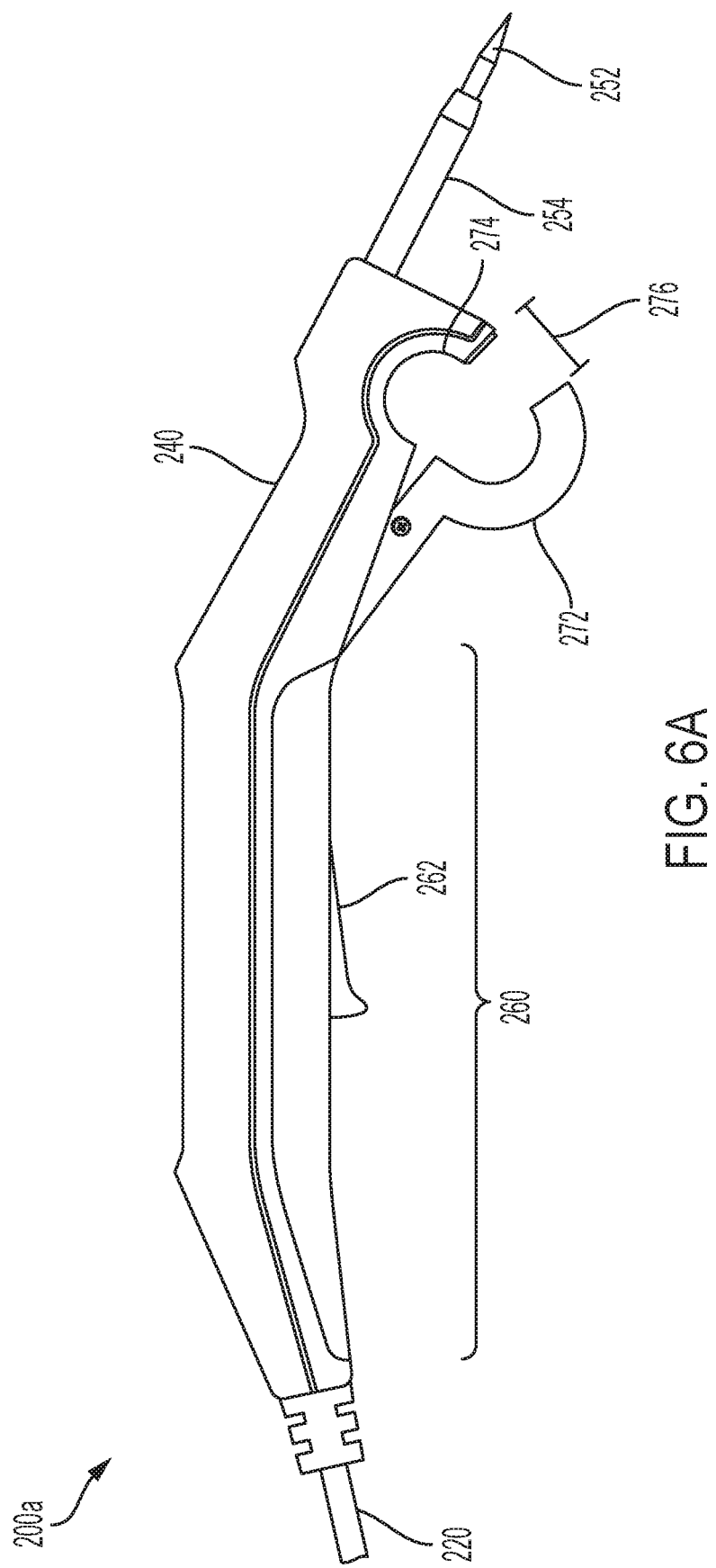
FIG. 6A is a side view of the probe device of FIG. 5 having a lever depressed to open the inductive clamp.

Probe device 200*a*, shown in FIGS. 4-6A, can have an inductive clamp 270 that could be used to indirectly measure current flowing through a wire that is disposed within an aperture defined by clamp 270. The user could simply depress lever 262 to move hinged core 272 as shown in FIG. 6A to open up inductive clamp 270. The user may then move probe device 200*a* such that a wire, such as wire 275, associated with an electronic circuit under test is disposed within aperture 273, defined by hinged core 272 and stationary core 274. The user could then release lever 262 to close inductive clamp 270 about wire 275 to easily and conveniently measure current through the wire.

Aspects of these, and other, embodiments are described in further detail below.

As previously stated, probe device 100*a* is shown in FIGS. 1-3A having a main body 130 and a probe body 140. Main body 130 comprises a grip 160 while probe body 140 comprises a probe connector 150, allowing a user of probe device 100*a* to easily apply probe connector 150 to any location on an electronic device to test (not shown) without needing to use a second hand. Grip 160 comprises a gripping surface with ergonomic features, such as indents 162 configured to receive fingers of a user's hand and improve friction force between a user's hand (not shown) and grip 160. While grip 160 is shown as having indents 162, grip 160 could be shaped in any suitable way to allow for a user's fingers to easily grip the surface of grip 160. Grip 160 could be made of any suitable material, such as a rubber, a thermoplastic, or a metal, but preferably comprises a non-conductive material having a higher elasticity than a non-conductive shell 139 of main body 130, allowing for a user's hand to slightly compress grip 160 during gripping to increase the friction force between the user's fingers and grip 160. For example, grip 160 could comprise a rubber having less than 1 GPa while shell 139 could comprise a thermoplastic having more than 10 GPa.

Probe device 100*a* also has a power connector 120, a ground connector 110, and a probe connector 150, allowing probe device 100*a* to alternatively apply either power or ground to probe connector 150. Power connector 120 is configured to couple to a power source. For example, in one embodiment power connector 120 could comprise a 6-foot wire that terminates in a male plug configured to plug into a female A/C outlet. In another embodiment, power connector 120 could comprise a 3-foot wire that terminates in an insulated alligator chip configured to electronically couple to a positive terminal of a car battery (or other DC power source). Ground connector 110 is configured to couple to a ground source, such as a conductive body via an alligator clip at the end of an 18-inch wire of ground connector 110 or a male digital multimeter (DMM) jack. Probe connector 150 is configured to be applied to a conductive surface of an electronic device via conductive tip 152.

Probe connector 150 comprises a conductive core that ends in a sharpened conductive tip 152 and comprises an insulation sleeve that limits the exposed conductive surface of probe connector 150. While power connector 120 is shown as a wire having a plug, ground connector 110 is shown as a wire having an alligator clip, and probe connector 150 is shown as a post having a beveled conductive tip, each of power connector 120, ground connector 110, and probe connector 150 could be configured in any suitable manner to electronically couple to an appropriate power source, ground source, and conductive surface, respectively. Both power connector 120 and ground connector 110 are preferably configured to couple to a power source and ground source, respectively, in a manner that holds them in place without any external force needing to be applied by a user, such that they stay coupled while a user moves probe device 100*a* with his/her hand, which could apply some lateral forces to any wires of power connector 120 and ground connector 110. This allows a user to freely move probe connector 150 around an electronic device without needing to worry about decoupling either power connector 120 or ground connector 110. Contemplated coupling mechanisms include biased clamps, mating indents and detents, male and female plugs, and threaded connections.

Probe connector 150 is preferably plug engageable with to a female outlet (not shown) of probe body 140 and is held in place within probe body 140 using friction force, such as a mating elastic indent/detent that holds an end (not shown) of probe connector 150 in place within the female outlet of probe body 140. Such receptacle jacks could be similar to those used for a DMM jack. In some embodiments, probe connectors of different shapes and/or sizes could be plugged into the female outlet to allow for different types of probe connectors to be coupled to probe body 140. For example, probe connectors that are J-shaped, angled, offset, thin, or flexible could be interchanged with probe connector 150 to plug into the same outlet. While ground connector 110 and power connector 120 are shown here as coupled to main body 130 and probe connector 150 is shown here as coupled to probe body 140, the terminals of probe device 100*a* could be coupled to any suitable portion of probe device 100*a* to allow for electricity to flow from the conductive surface of the terminal to the internal circuitry of probe device 100*a*.

User interface 130*a* is disposed on a top surface of main body 130. User interface 130*a* is preferably placed on an opposite side of grip 160 on probe device 100*a* to allow for a user's fingers to grip the surface of grip 160 while the user's thumb is positioned to manually regulate the operation of elements of user interface 130*a*. This allows a user to manipulate any switches of user interface 130*a* without needing to move the user's fingers from grip 160 or move probe device 100*a* in any manner to displace probe connector 150 in order to interact with user interface 130*a*. In some embodiments, another user interface could be positioned opposite user interface 130*a*, for example a trigger that activates a light, such as light 146. In such an embodiment, the user could activate the trigger with a forefinger while simultaneously regulating operation of user interface 130*a*.

User interface 130*a* has a breaker reset button 131, a beeper button 132, a main switch 133, a voltage switch 134, a display 135, a positive light 136, and a negative light 137. Main switch 133 is shown as a 3-position rocker switch having an overmold rubber cover that allows a user to push forward to a forward position (or power position) to switch main switch 133 to a positive applied voltage mode, backward to a rear position (or ground position) to switch main switch 133 to a negative, or ground, applied voltage mode, and to the center position (or measure position) to switch main switch 133 to a voltage measure mode. Main switch 133 is preferably biased to return to the measure position when no force is placed on main switch 133 (e.g. when a user releases a thumb from main switch 133) so that probe device 100a, by default, measures attributes of the electronic circuit under test. Main switch 133 could be configured to be biased to return to the measure position using any suitable means, for example by using a spring or a resiliently deformable flange. Preferably, main switch 133 is configured such that main switch 133 is only in one position at a time, which prevents probe device 100a from being placed in a mode that can both apply power and measure voltage or current simultaneously.

Referring to the exemplary embodiment having three positions (a power position, a ground position, and a measure position) above, when main switch 133 is in the power position, a processor (not shown) in probe device 100a preferably transmits power from power supply connector 120 to probe connector 152. The amount of power applied can be controlled by manipulation of voltage switch 134, which is shown as controlling the power output between 3 volts, 5 volts, and 12 volts. When a user moves voltage switch 134 from the 3-volt position to the 12-volt position, the amount of voltage applied to probe connector 150 when main switch 133 is pushed to the power position is changed from 3 volts to 12 volts. Preferably display 135 does not show any numerical values while main switch 133 is in the power position, allowing a user to quickly note that probe device 100a is not in measurement mode with a quick glance at display 135. While voltage switch 134 is shown as being configured to allow a user to switch the power output between three different modes, more or fewer switching modes, such as two modes or five modes, could be used in alternative embodiments.

Probe device 100a is configured to display voltage values on display 135 when probe device 100a is in measure mode. Display 135 is configured to display voltage that is measured by probe connector 150. For example, when main switch 133 is in the measure position and conductive tip 152 probe connector 150 is applied to a conductive surface of an electronic circuit under test, display 135 will display the measured voltage on display 135. As noted previously, when main switch 133 is in the measure position, no power is applied to probe connector 150 from probe device 100a. In preferred embodiments, this measured voltage will continue to be shown on display 135 until a user moves main switch 133 to another position, or until power connector 120 is unplugged from a power source. In this way, if a user is not able to see display 135 when probe connector 150 is applied to an electronic device and main switch is in the measure position, the user can later look at display 135 to see what the measured voltage is.

In some embodiments, the measured voltage may change over time, such as when a conductive surface has a periodic voltage shift, or when a user applies probe tip 152 to many different conductive surfaces while main switch 133 is in a measure position. In this embodiment, a memory (not shown) of probe device 100a could save a series of measured voltages at different periods of time, and could replay those voltages in a loop on display 135. The periods of time could be preprogrammed or could be set by a user via a separate connection (e.g. a Bluetooth wireless connection or a USB connection). For example, a user or an admin could set probe device 100a to save 5 seconds of voltage measurements, one for every 0.1 seconds, or 10 seconds of voltage measurements, one for every 0.5 seconds. In other embodiments, a user could save measured voltages, for example by pushing down on main switch 133 (i.e. towards grip 160) while main switch 133 is in the measure position.

Probe device 100a could also be configured to activate positive light 136 when main switch 133 is in the power position and activate negative light 137 when main switch 133 is in the ground position, rapidly informing a user of probe device 100a when probe connector 150 is safe to touch. When power is not applied to probe connector 150, for example when main switch 133 is in the measure position, probe device 100a could be configured to activate positive light 136 when probe connector 150 measures a non-zero voltage, and could be configured to activate negative light 137 when probe connector 150 measures a ground charge. Again, this rapidly informs a user when probe connector 150 is safe to touch. Positive light 136 is preferably a red LED to provide a warning notification while negative light 137 is preferably a greed LED to provide a safety notification, although other colors and/or types of light are contemplated.

Beeper button 132 provides a way for a user to activate or deactivate a beeper that activates when probe connector 150 is not safe to touch, for example when a positive voltage is measured via probe connector 150 when probe device 100a is in measure mode, or when a positive voltage is applied to probe connector 150 when probe device 100a is in a power mode. The beeper speaker preferably deactivates when probe connector 150 is safe to touch, for example when a ground voltage is measured via probe connector 150 when probe device 100a is in measure mode or when a ground voltage is applied to probe connector 150 when probe device 100a is in a ground mode. In this manner, the speaker (not shown) could act similarly to positive light 136 and negative light 137, providing an auditory signal that probe connector 150 is safe or not safe to touch in addition to the visual signal of positive light 136 and negative light 137.

Breaker reset button 131 provides a way for a user to reset an internal fuse (not shown) of probe device 100a. The internal fuse shuts off power between power connector 120 and electronic components of probe device 100a when a voltage or a current exceeds a predefined threshold to prevent electronic components from being damaged. When a user presses breaker reset button 131, the internal circuit breaker is reset, allowing power to flow from power connector 120 to the internal circuitry of probe device 100a.

A user of probe device 100a may attempt to apply probe connector 150 to conductive terminals that are difficult to reach, such as terminals behind an obstacle or at an awkward angle from where a user is. In these situations, it is useful to alter an angle between the probe axis 174 of probe body 140 relative to the main axis 172 main body 130, such as in the configuration shown in FIG. 3A. Main body 130 has a main axis 172 running along its major length shown in FIG. 2, while probe body 140 has a probe axis 174 running along its major length shown in FIG. 3A. In FIG. 2, main axis 172 is shown as substantially parallel to probe body 174 while in FIG. 3A, main axis 172 is shown as angled at substantially a 60-degree angle to probe body 174. As used herein, two axis that are substantially parallel to one another are parallel to one another within 1, 2, 3, 4, or 5 degrees from one another.

Joint 142 is shown here as a rotational condyloid joint having an ovoid cross-sectional rotation surface. A user can rotate probe body 140 relative to main body 130 by twisting probe body 140 in a clockwise or counter-clockwise direction to rotate probe body 140 between a first configuration shown in FIG. 2 and a second configuration shown in FIG. 3A about rotational axis 182 which is not normal to the main axis 172. The probe body 140 and the main body rotate about mating surfaces which are non-normal to the main axis 172. Preferably, main body 130 and probe body 140 are configured to have mating indents and detents that hold the two bodies in place relative to one another when in the first configuration and in the second configuration.

While joint 142 is shown as a rotational condyloid joint, any suitable joint or pivot point could be used to allow main body 130 and probe body 140 to rotate relative to one another, such as a hinge joint, a pivot joint, a ball and socket joint, or a saddle joint. Likewise, while joint 142 allows a user to rotate main body 130 and probe body 140 between only two different angles relative to one another, joint 142 could be configured to allow main body 130 and probe body 140 to rotate to many different angles relative to one another, for example a parallel angle, a 30 degree angle, a 60 degree angle, a 90 degree angle, a 120 degree angle, and so on and so forth.

While only two bodies—main body 130 and probe body 140—are shown coupled to one another via a joint 142, probe device 100a could comprise any number of components that rotate relative to one another in any number of ways in alternative embodiments. Probe device embodiments having a plurality of joints may be useful to thread a probe device through a complex passageway.

Portions of probe device 100a are shown as having a non-conductive rubber overmold having an elastic tensile strength (e.g. less than 1 GPa) used to improve friction tension for when a user grips the overmold areas, and to decrease abrasive damage that could be caused by a user brushing up against a nonelastic surface. Preferably, main switch 133 has a rubber overmold to assist a user who moves main switch 133 from one position to another position, breaker reset button 131 and beeper button 132 have rubber overmolds to assist a user to push the buttons to activate a breaker or activate/deactivate a beeper, and portions of probe body 140 have rubber overmold 144 to assist a user to rotate probe body 140 relative to main body 130.

A probe light 146 is preferably mounted on an end of probe body 140 to illuminate an area that probe connector 150 is applied to. Probe light 146 is preferably a white, bright LED, although any color and/or type of light could be used in alternative embodiments. Probe light 146 preferably activates when a user pushes or pulls on main switch 133, and deactivates after a threshold time period has passed, such as 1-2 minutes. While probe light 146 is shown as coupled to an end of probe body 140, probe light could be coupled to any portion of probe device 100a in alternative embodiments, and could be even mounted to a stiff arm that could be aimed by a user by manipulating the stiff arm. Activation of probe light 146 could be triggered in any suitable manner, for example by an accelerometer that detects a minimum threshold movement of probe device 100a, or by an index-finger trigger located on grip 160 of probe device 100a.

Figure 3B:
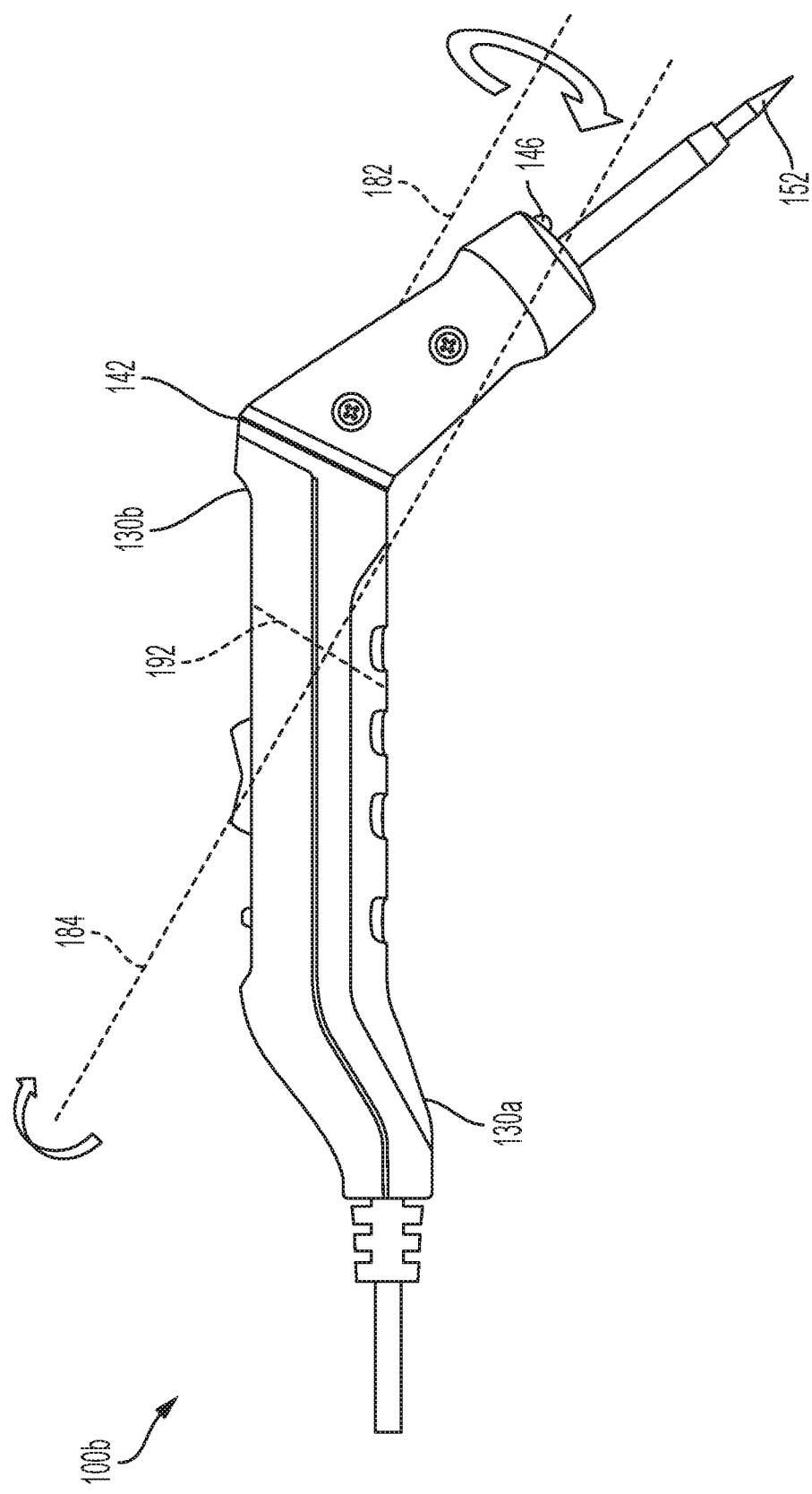
FIG. 3B is a side view of an alternative probe device having a second joint 192 that could be used to rotate the probe connector to be offset the main axis of the main body.

FIG. 3B shows an alternative probe device 100b having first joint 142 and second joint 192. Second joint 192 comprises a second condyloid joint that rotates a first portion of main body 130a relative to a second portion of main body 130b about a rotational axis 184. A user could rotate the second portion of main body 130b relative to probe body 140 about first joint 142 and rotational axis 182 and rotate the first portion of main body 130a relative to the second portion of main body 130b about second joint 192 and rotational axis 184 to offset conductive probe tip 152 from the first portion of main body 130a. This could be useful in scenarios where a user needs to snake conductive probe tip 152 just to the side of an obstacle.

Figure 3C:
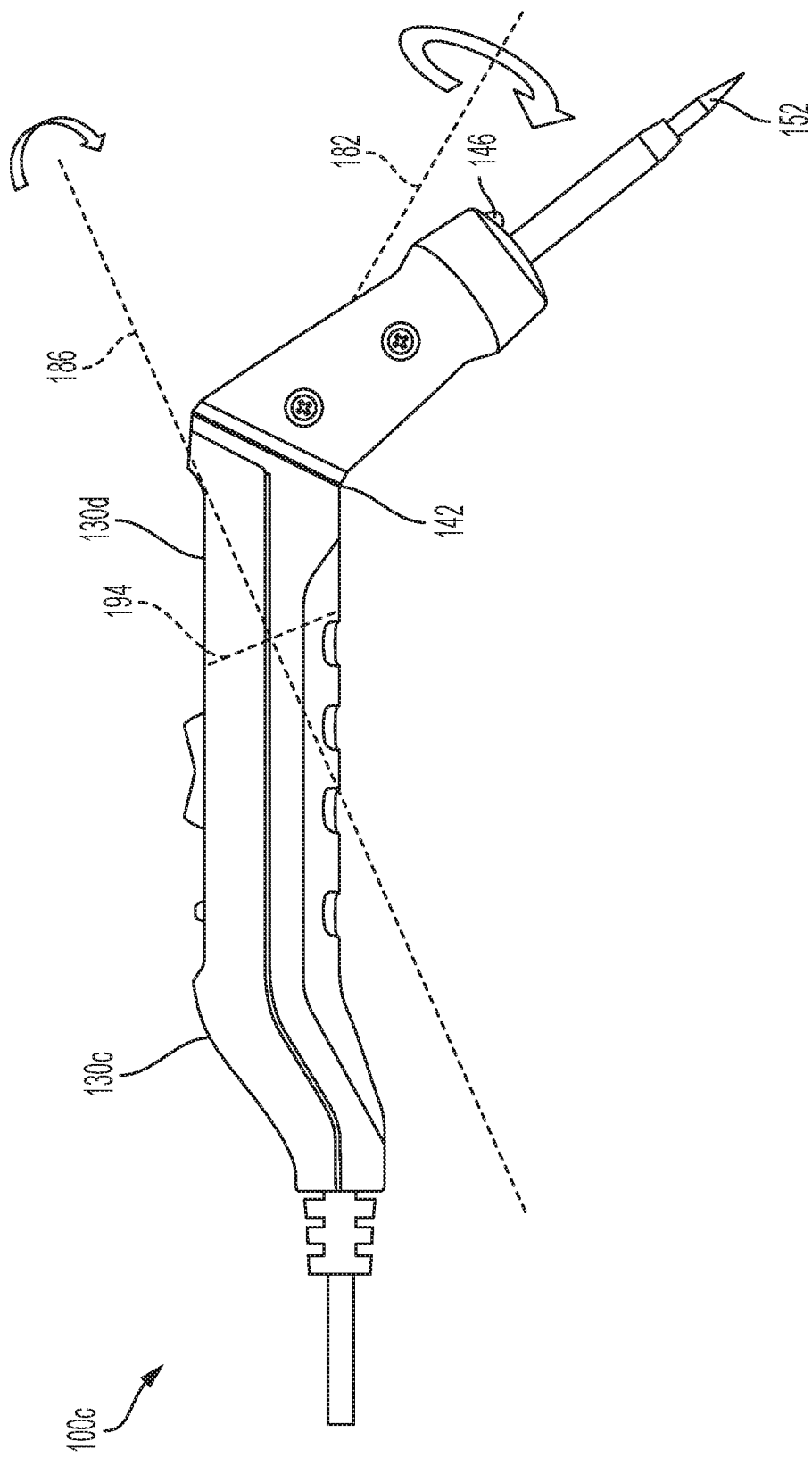
FIG. 3C is a side view of an alternative probe device having a second joint 194 that could be used to rotate the probe device to have a U-shape.
Figure 4:
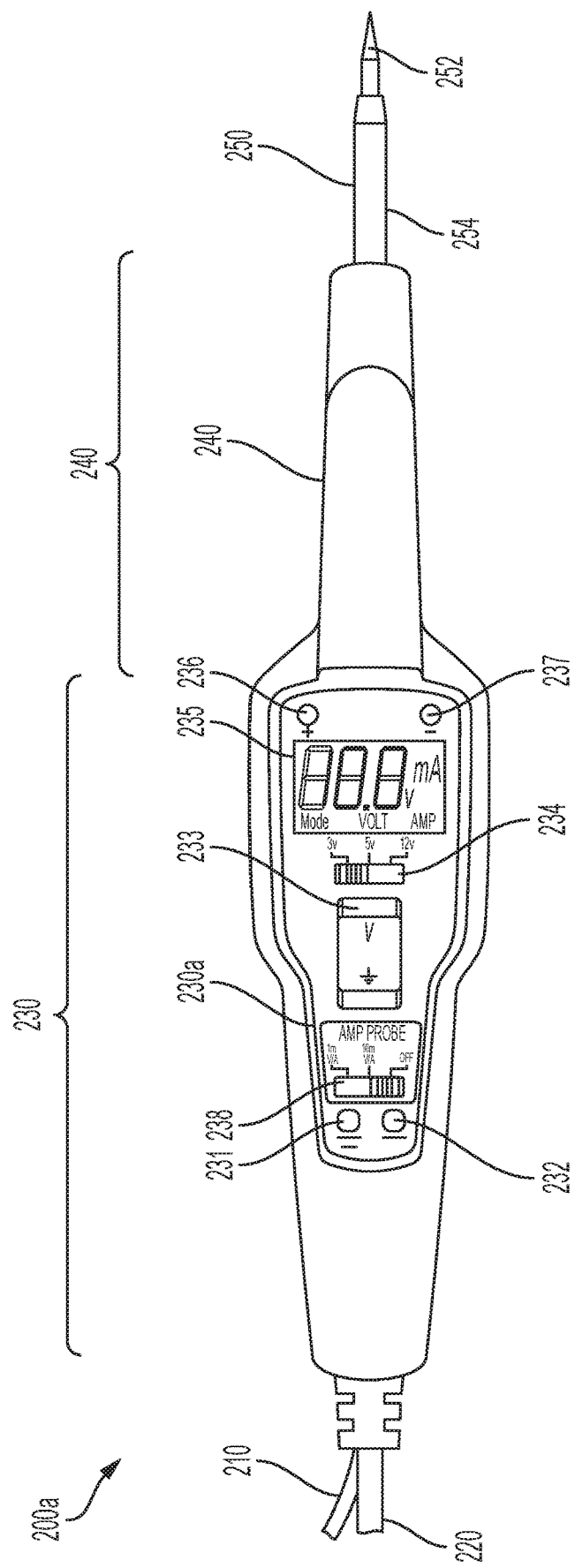
FIG. 4 is a top view of another exemplary probe device having an inductive clamp.
Figure 5:
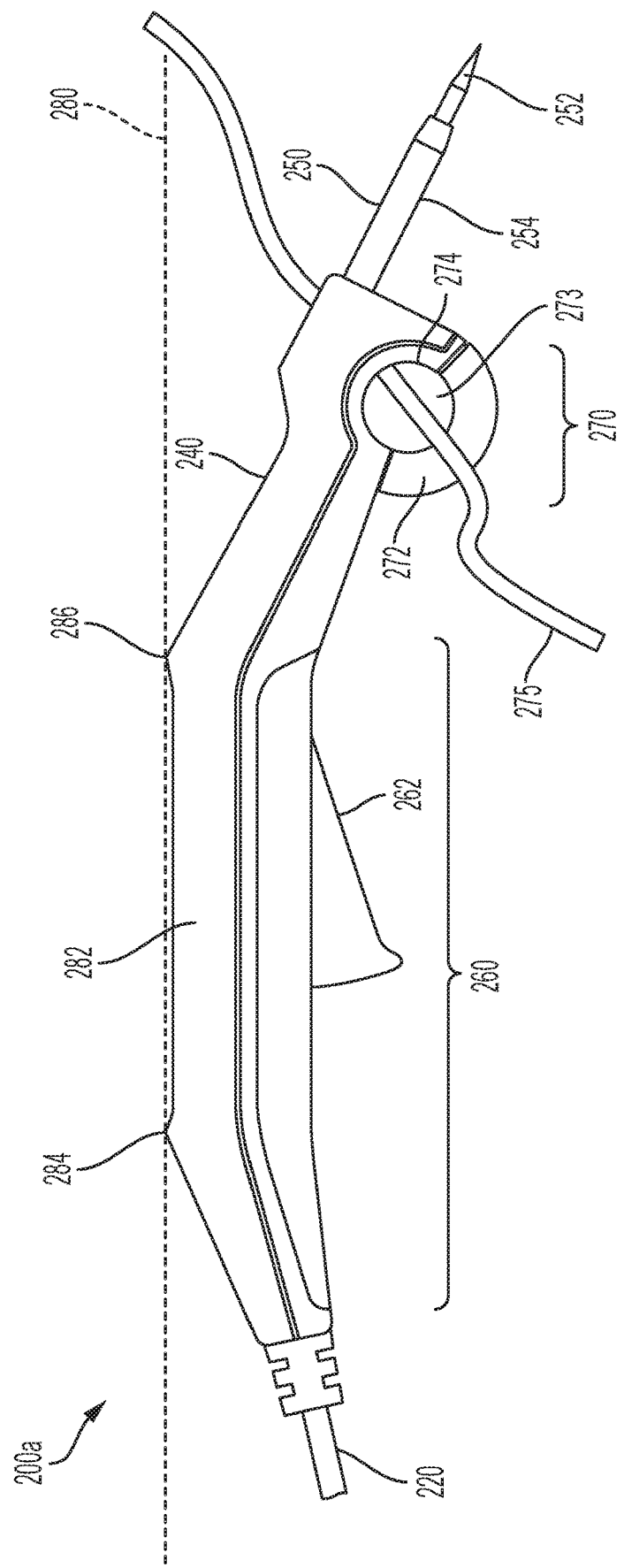
FIG. 5 is a side view of the probe device of FIG. 4.

FIG. 3C shows another alternative probe device 100c having a first joint 142 and a second joint 194. Second joint 194 comprises another condyloid joint that rotates a first portion of main body 130c relative to a second portion of main body 130d about rotational axis 186. Similar to probe device 100b, a user of probe device 100c could rotate the second portion of main body 130d relative to probe body 140 about first joint 142 and rotational axis 182 and rotate the first portion of main body 130c relative to the second portion of main body 130d about second joint 194 and rotational axis 186 to offset conductive probe tip 152 from the first portion of main body 130a. This could be useful in scenarios where a user needs to snake conductive probe tip 152 around an obstacle in a U-shaped manner to wrap around the obstacle. While a condyloid joint is shown in FIGS. 3B and 3C, any other suitable joint could be used to alter a shape of probe device 100b or 100c to allow conductive probe tip 152 to access previously inaccessible areas.

An alternative probe device 200a is shown in FIGS. 4-6A, where the main body 230 and the probe body 240 are formed of a single contiguous piece. Probe device 200a is similar to probe device 100a, in that probe device 200a also has a power connector 210, a ground connector 220, a probe connector 250, and a grip 260 opposite a user interface 230a, wherein user interface 230a has a breaker reset button 231, a beeper button 232, a main switch 233, a voltage switch 234, a display 235, a positive light 236, and a negative light 237, which each function similarly to their corresponding parts on probe device 100a. However, probe device 200a has an induction clamp 270 that could be used to inductively measure a current in wire 275 clamped by induction clamp 270.

Induction clamp 270 comprises a clamp that inductively measures current via an inductive coil. Typical induction clamps use a hinged core with a compensation winding wrapped around a portion of the core, where the opening of the clamp acts as a magnetic field sensor within an air gap. Any suitable induction clamp could be used. Induction clamp 270 comprises a stationary core 274 embedded within a bottom section of probe body 240 and comprises a hinged core 272 controlled by lever 262 on grip 260. When a user's fingers (e.g. a user's forefingers or index and middle fingers) pull on lever 262, hinged core 272 opens, as shown in FIG. 6A, allowing the user to dispose induction clamp 270 around wire 275 for indirectly measuring a current through wire 275. Lever 262 is preferably biased, for example using a spring, to open when force is applied to lever 262, allowing a user to close hinged core 272 by simply releasing a compressive force on lever 262.

User interface 230a comprises a current switch 238 that is configured to allow a user to activate an inductive current-measuring mode, and to alter the amount of currents measured by the probe device. Both the voltage-measuring mode and the current-measuring mode are preferably modes wherein probe 200a does not apply any voltage to probe connector 250. Here, current switch 238 is shown as a switch that switches probe device 230 between three modes—an off mode, a 1 mV/A mode, and a 10 mV/A mode. More or less modes could be used in other embodiments. When current switch 238 is switched to off mode, probe device 230 is configured to measure volts flowing through probe connector 250 only, allowing probe device 230 to act similarly to probe device 130. Display 235 is configured to display a VOLT indicator, which indicates to a user that probe device 230 is in volt measurement mode. When current switch 238 is switched to 1 mV/A mode, probe device 230 is configured to measure a first range of amps flowing through probe connector 250 (e.g. 5 A to 300 Arms). In 1 mV/A mode, display 235 displays an AMP indicator, which indicates to a user that probe device 230 is in current measurement mode. When current switch 238 is switched to 10 mV/A mode, probe device 230 is configured to measure a second range of amps flowing through probe connector 250 (e.g. 50 A to 3000 Arms). In 10 mV/A mode, display 235 also displays an AMP indicator, indicating to a user that probe device 230 is in current measurement mode.

Clamp 270 is preferably disposed adjacent to probe connector 250, which allows a user to easily manipulate the position of probe connector 250 by manipulating grip 260 with only one hand.

User interface 230a is disposed to be slightly recessed from an upper surface of main body 230, allowing portions of the user interface, such as breaker reset button 231, beeper button 232, and main switch 233 to remain below an upper plane 280 of probe device 200a. This allows a user to set probe device 200a down on the side of user interface 230a without danger of contact with a table surface or a floor surface accidentally interacting with user interface 230a (e.g. pressing any buttons or pushing any switches of user interface 230a). The upper surface of main body 230 preferably has a recess 282 to form legs 284 and 286, which further assist in allowing a user to place probe 200a on a surface with the upper surface of main body 230 facing down without accidentally activating any of the buttons or switches on user interface 230a.

Figure 6B:
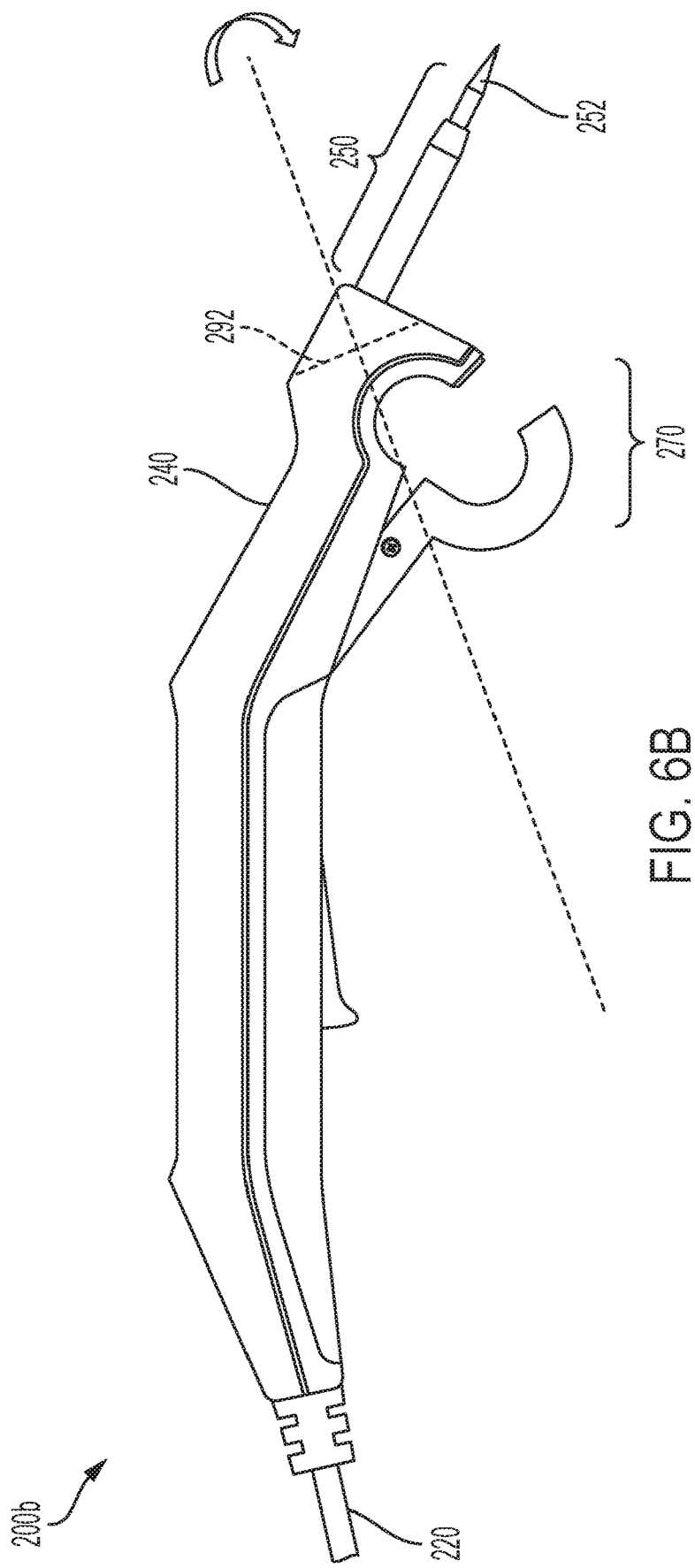
FIG. 6B is a side view of an alternative probe device having a joint 292 on a top end of the probe body.

FIG. 6B shows an alternative probe device 200b having a joint 292 along a top edge of probe body 240. Joint 292 represents another condyloid joint that allows probe connector 250 to rotate at a substantially 90-degree angle relative to the orientation shown in FIG. 6B, allowing conductive probe tip 252 to reach around obstacles to contact conductive surfaces of an electronic circuit under test that probe device 200b was previously unable to reach. While a condyloid joint is shown, any other suitable joint could be used to alter a shape of probe device 200b to allow conductive probe tip 252 to access previously inaccessible areas.

Figure 7:
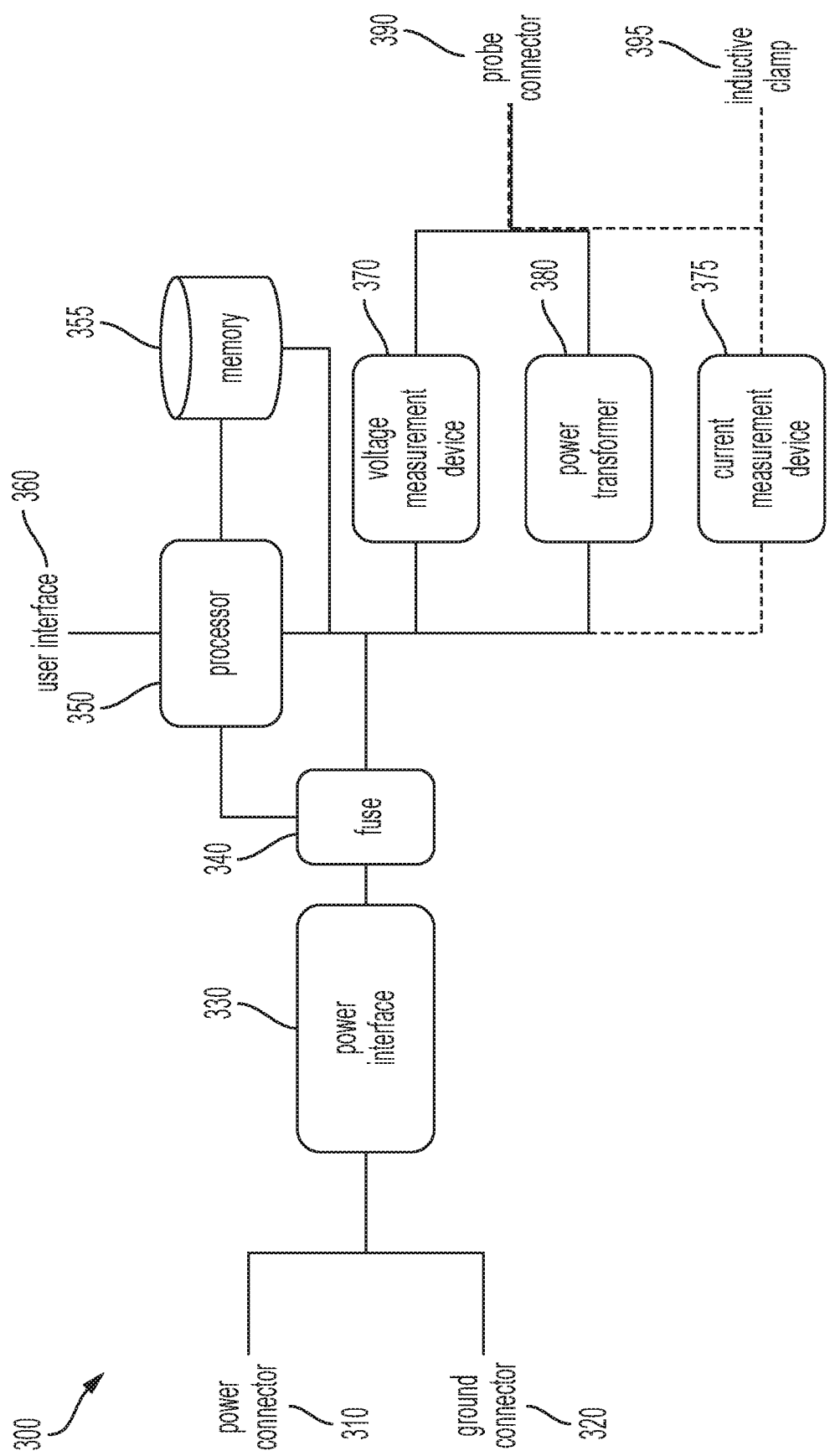
FIG. 7 is a schematic diagram of an exemplary probe device.

FIG. 7 shows a logical schematic 300 of a probe device having a power connector 310, a ground connector 320, a power interface 330, a fuse 340, a processor 350, memory 355, a user interface 360, a voltage measurement device 370, current measurement device 375, a power transformer 380, and a probe connector 390. In some embodiments, a current measurement device 375 could be used to measure current flowing through probe connector 390. In other embodiments, such as with probe device 200a, a current measurement device 375 could be used to indirectly measure current flowing through wire 275 through inductive clamp 395.

Power interface 330 interfaces with both the ground connector 320 and the power connector 310 to receive power from a power source coupled to power connector 310 and to receive ground from a ground source coupled to ground connector 320. Power interface 330 also provides power to components of the probe device, such as processor 350, memory 355, measurement 370, and power transformer 380, via fuse 340. If processor 350 detects a power surge in one of the connected devices, or if fuse 340 detects a power surge from power connector 310, a command could be sent to fuse 340 to break a power connection between power interface 330 and any of processor 350, memory 355, voltage measurement device 370, power transformer 380, and/or current measurement device 375 and prevent the power surge from damaging any of the electronic components of the probe device. When a user transmits a break command from user interface 360 (e.g. via break button 131 or break button 231), processor 350 could receive the command and send a reset command to fuse 340 to reset the fuse and allow power to flow again from power interface 330.

Processor 350 executes software instructions saved on memory 355 to control the various electrical components of the probe device and to process commands transmitted by user interface 360. For example, where user interface 360 transmits a command to processor 350 to operate in voltage measurement mode, processor 350 could transmit a command to voltage measurement device 370 to measure a voltage via probe connector 390 and output that measured voltage amount to a display of user interface 360. Where user interface 360 transmits a command to processor 350 to operate in current measurement mode to measure current flowing through probe connector 390, processor 350 could transmit a command to current measurement device 375 to measure current flowing through probe connector 390 and outputs that measured current amount to a display of user interface 360. Where user interface 360 transmits a command to processor 350 to operate in current measurement mode to measure current flowing through inductive clamp 395, processor 350 could transmit a command to current measurement device 375 to inductively measure current from wire 275 within inductive clamp 395 and outputs that measured current amount to a display of user interface 360. In some embodiments, the measured attributes could temporarily be saved on memory 355 to be output to a display of user interface 360 over a period of time, or at a later time.

Where user interface 360 transmits a command to processor 350 to operate in power mode at a specified voltage (e.g. 3V, 5V, or 12V), processor 350 could transmit a command to power transformer 380 to transmit the specified voltage from power connector 310 to probe connector 390. When the probe device is in power mode, processor 350 could also activate a positive light of user interface 360 (e.g. positive light 136 of probe device 100a), and could transmit a command to user interface 360 to deactivate the display that displays a measured voltage. Where user interface 360 transmits a command to processor 350 to operate in ground mode, processor 350 could transmit a command to power transformer 380 to transmit the ground voltage from ground connector 320 to probe connector 390. When the probe device is in ground mode, processor 350 could also activate a negative light of user interface 360 (e.g. negative light 137 of probe device 100a), and could transmit a command to user interface 360 to deactivate the display that displays a measured voltage. Where user interface 360 transmits a command to processor 350 to activate a speaker when voltage is flowing through probe connector 390 (e.g. because power transformer 380 is transmitting voltage from power connector 310, because voltage measurement device 370 detects a voltage from probe connector 390, or because current measurement device 375 detects a current from probe connector 390), then processor 350 could transmit a buzzing noise to a speaker of user interface 360 when a voltage or current is detected to be flowing through probe connector 390.

In preferred embodiments, the probe device is configured such that voltage measurement device 370 and power transformer 380 cannot be activated simultaneously. This is to ensure that the device does not apply and measure voltage or current simultaneously.

Using the disclosed embodiments, a user could easily use a probe device, such as probe device 100a or probe device

200*a*, to apply power, apply ground, measure voltage, or measure current of an electronic device all with just one hand.

For example, a user could use probe device 100*a* to measure voltage of an electronic device by coupling power connector 120 to a power source, such as by plugging a male plug into a female A/C outlet, and by coupling ground connector 110 to a ground source, such as a conductive body of the electronic device. The user could then ensure that main switch 133 is in the measure position, for example by using a thumb to manipulate main switch 133, or by not applying any force to main switch 133 in embodiments where main switch 133 is biased to always return to the measure position when no force is applied to main switch 133. When main switch 133 is in the measure position, the user could then manipulate grip 160 to position the conductive tip 152 of probe device 100*a* to any conductive surface of the electronic circuit under test to determine how much voltage is that conductive surface has as compared to ground. Probe device 100*a* would then measure the voltage, and display the measured voltage on display 135, illuminate the positive light 136 if the measured voltage is greater than zero, and illuminate the negative light 137 if the measured voltage is zero. If the user is in a position where they cannot see display 135, the user could push beeper button 132 to activate the beeper, instructing probe device 100*a* to make an audible beep if the measured voltage is greater than zero, and not make an audible beep if the measured voltage is zero.

If the conductive surface of the electronic circuit under test is in an area that cannot accommodate the full length of probe device 100*a*, the user could rotate probe body 140 relative to main body 130 by grabbing probe body 140 with one hand and main body 130 with another hand and twisting to move probe device 100*a* from the first configuration shown in FIG. 2 to the second configuration shown in FIG. 3A. This way, conductive tip 152 could be more easily maneuvered behind obstacles or around short passages that cannot accommodate the full length of probe device 100*a*. In some embodiments where a user might need to use a probe connector of a different shape or size, the user could unplug probe connector 150 from probe body 140 and could plug a new probe connector into the female socket.

Should a user wish to temporarily apply power or ground to an electronic circuit under test (e.g. if the user wishes to activate the electronic device but it is not plugged in, or if the user wishes to discharge the electronic device to be able to move it to a second location), the user could use their thumb to push main switch 133 to the positive position, or pull main switch 133 to the negative position. When main switch 133 is in the positive position, probe device 100*a* could activate the positive warning light 136, and could activate a beeper if the beeper has been turned on. When main switch 133 is in the negative position, probe device could activate the negative warning light 137. If a power surge activates an internal fuse of probe device 100*a*, the probe device could break a circuit between the power from power connector 120 and one or more electrical components of probe device 100*a*, and the user could press breaker reset button 131 to reset the internal fuse. All of the essential operations of probe device 100*a* can be performed easily with one hand once the user has connected power connector 120, ground connector 110, and has set probe device 100*a* to the proper straight or angled configuration.

A user could also use probe device 200*a* to perform similar functions, such as measuring voltage, applying power, applying ground, and measuring voltage, and could also use probe device 200*a* to inductively measure current of a wire, such as wire 275. The user could first use their thumb to push current switch 238 from the off position to one of the active positions, such as 10 mV/A, which would trigger probe device 200*a* to alter display 235 from displaying the word VOLT to displaying the word AMP as an indicator that probe device 200*a* is now in current-measurement mode. The user could then use their fingers to pull on lever 262 and open hinged core 272. Once hinged core 272 is open, the user could move probe device 200*a* to wrap either stationary core 274 or hinged core 272 around wire 275 under test and release lever 262 to close hinged core 272. Probe device 200*a* would then indirectly measure current in wire 275 via induction, which would then be displayed on display 235.

The above description is given by way of example, and not limitation. Given the above disclosure, one skilled in the art could devise variations that are within the scope and spirit of the invention disclosed herein, including various ways of manufacturing and using probe devices. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A probe device, comprising:
   a ground connector that electronically couples to a ground source;
   a hand-held main body which is grippable by a person during measurement of a voltage of an external electrical circuit, the hand-held main body defining a main body axis extending along a length of the main body;
   a probe body defining a probe body axis extending along the length of the probe body, the probe body defining a conductive tip disposed at a distal end of the probe body, along the probe body axis, the conductive tip being adapted for abutting electrical contact with the external electrical circuit;
   wherein the main body and the probe body define adjacent mating surfaces extending non-normal to the main body axis;
   wherein the probe body is rotatably coupled to the main body via a joint that allows rotation of the probe body between a first position wherein the probe body axis is disposed coaxial with the main body axis and at least one second position wherein the probe body axis extends at an angle displaced from the main body axis, the rotation of the probe body being operative to progressively increase a displacement angle defined by the probe body axis and the main body axis to facilitate contact of the conductive tip of the probe body to the external electrical circuit disposable at a location offset from the main body axis.

2. The probe device of claim 1, wherein the joint comprises a locking mechanism that holds the probe body in place relative to the main body when the probe body is rotated to at least one of the second positions.

3. The probe device of claim 2, wherein the locking mechanism comprises matching indents and detents that mate with one another when the probe connector is in at least one of the second positions.

4. The probe device of claim 1, wherein the joint comprises a condyloid joint having an ovoid cross-sectional rotation surface.

5. The probe device of claim 4, further comprising:
a main switch disposed on the main body, the main switch being translatable between a measure voltage position and an apply voltage position,
wherein when the main switch is in the measure voltage position, the switch enables measurement of a voltage on the electrical circuit where the probe tip contacts the electrical circuit, and when the main switch is in the apply voltage position, the switch enables application of a voltage to the electrical circuit where the probe tip contacts the electrical circuit.

6. The probe device of claim 5,
wherein the main switch remains in a consistent viewing position on the main body as the probe body is rotated.

7. The probe device of claim 6 further comprising:
an inductive clamp disposed on the main body, the inductive clamp being operative to detect current flow through a conductor disposed within a space defined by the inductive clamp;
a lever disposed on the main body for opening the inductive clamp when a first compressive force is applied to the lever toward the probe body and closes the inductive clamp when the compressive force is released from the lever, and
a current measuring switch disposed on the main body proximate the lever, the current measuring switch being translatable to enable measurement of current flow through a conductor disposed within the space defined by the electrical clamp.

8. The probe device of claim 1 wherein the probe body rotates about an axis which is translatable between an orientation coaxial with the main body axis to an orientation angularly displaced from the main body axis.

9. The probe device of claim 6 wherein the probe body defines a hand gripping surface disposed along the probe body substantially opposite the main switch.

10. The probe device of claim 5 wherein the main switch is biased to return to the measure voltage position when no external force is applied to the main switch.

\* \* \* \* \*